(12) United States Patent
Miura et al.

(10) Patent No.: US 8,258,891 B2
(45) Date of Patent: Sep. 4, 2012

(54) ACOUSTIC WAVE DEVICE, DUPLEXER, COMMUNICATION MODULE, COMMUNICATION APPARATUS, AND MANUFACTURING METHOD FOR ACOUSTIC WAVE DEVICE

(75) Inventors: Michio Miura, Kawaski (JP); Suguru Warashina, Kawasaki (JP); Takashi Matsuda, Kawasaki (JP); Shogo Inoue, Kawasaki (JP); Kazunori Inoue, Kawasaki (JP); Satoru Matsuda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 441 days.

(21) Appl. No.: 12/608,397

(22) Filed: Oct. 29, 2009

(65) Prior Publication Data
US 2010/0219906 A1    Sep. 2, 2010

(30) Foreign Application Priority Data

Feb. 27, 2009    (JP) .................................. 2009-046294

(51) Int. Cl.
| H03H 9/25 | (2006.01) |
| H03H 9/15 | (2006.01) |
| H03H 9/70 | (2006.01) |
| H03H 9/72 | (2006.01) |
| H03H 3/02 | (2006.01) |
| H03H 3/08 | (2006.01) |
| H03H 3/04 | (2006.01) |
| H03H 3/10 | (2006.01) |

(52) U.S. Cl. ..... 333/133; 333/193; 333/195; 310/313 B; 29/25.35; 29/594

(58) Field of Classification Search .......... 333/193–196, 333/133; 310/313 B; 29/25.35, 594, 609.1
See application file for complete search history.

(56) References Cited

U.S. PATENT DOCUMENTS

| 6,218,763 | B1 | 4/2001 | Fujimoto et al. |
| 7,230,365 | B2 | 6/2007 | Nishiyama et al. |
| 7,327,071 | B2 * | 2/2008 | Nishiyama et al. ....... 310/313 A |
| 7,411,334 | B2 | 8/2008 | Nishiyama et al. |
| 7,418,772 | B2 | 9/2008 | Nishiyama et al. |
| 2004/0164644 | A1 | 8/2004 | Nishiyama et al. |
| 2005/0099091 | A1 | 5/2005 | Mishima et al. |
| 2006/0103486 | A1 | 5/2006 | Ruile et al. |
| 2007/0132339 | A1 | 6/2007 | Nishiyama et al. |

(Continued)

FOREIGN PATENT DOCUMENTS

EP    1391988 A2    2/2004

(Continued)

OTHER PUBLICATIONS

Japanese Office Action dated Jun. 28, 2011, in a counterpart Japanese patent application No. 2009-046294.

*Primary Examiner* — Barbara Summons
(74) *Attorney, Agent, or Firm* — Chen Yoshimura LLP

(57) ABSTRACT

An acoustic wave device includes a piezoelectric substrate, interdigital electrodes arranged on the piezoelectric substrate, a first dielectric element arranged between the interdigital electrodes, a second dielectric element that covers the interdigital electrodes and the first dielectric element, and an adjustment element that has been formed on the first dielectric element. The adjustment element has been formed from a material whose specific gravity is greater than that of the first dielectric element and that of the second dielectric element.

8 Claims, 10 Drawing Sheets

U.S. PATENT DOCUMENTS

| | | |
|---|---|---|
| 2007/0214622 A1 | 9/2007 | Nishiyama et al. |
| 2007/0222337 A1* | 9/2007 | Kadota et al. ............ 310/320 |
| 2008/0067896 A1 | 3/2008 | Inoue et al. |
| 2008/0074212 A1 | 3/2008 | Matsuda et al. |
| 2009/0058225 A1 | 3/2009 | Kadota |

FOREIGN PATENT DOCUMENTS

| | | |
|---|---|---|
| JP | 2007-235711 A | 9/2007 |
| JP | 2007-251710 A | 9/2007 |
| JP | 2004-112748 A | 4/2008 |
| JP | 2008-079227 A | 4/2008 |
| JP | 2008-113061 A | 5/2008 |
| KR | 2000-0017526 A | 3/2000 |
| KR | 10-2005-0045913 A | 5/2005 |
| KR | 10-2005-0095624 A | 9/2005 |
| KR | 10-2008-0024451 A | 3/2008 |
| WO | WO 98/52279 A1 | 11/1998 |
| WO | 2007/138844 A1 | 12/2007 |

\* cited by examiner

ACOUSTIC WAVE DEVICE, DUPLEXER, COMMUNICATION MODULE, COMMUNICATION APPARATUS, AND MANUFACTURING METHOD FOR ACOUSTIC WAVE DEVICE

CROSS-REFERENCE TO RELATED APPLICATION

This application is based upon and claims the benefit of priority of the prior Japanese Patent Application No. 2009-46294 filed on 27.2.2009, the entire contents of which is incorporated herein by reference.

FIELD

The embodiment discussed herein is related to an acoustic wave device. The embodiment discussed herein are related to a duplexer, a communication module, and a communication apparatus that include an acoustic wave device. The embodiment discussed herein is related to a manufacturing method for an acoustic wave device.

BACKGROUND

An acoustic wave device can be used as a filter element or oscillator in, for example, a television receiver, a mobile phone terminal, or a PHS (Personal Handy-phone System). An FBAR (Film Bulk Acoustic-wave Resonator) and a SAW (Surface Acoustic Wave) device are widely-known examples of devices that make use of acoustic waves (e.g., see JP 2004-112748A, International Publication WO 98/52279, and JP 2008-113061A). A SAW device can be used in various types of circuits in an apparatus that processes wireless signals in, for example, the 45 MHz to 2 GHz frequency band. A SAW device can be used in, for example, a transmission bandpass filter, a reception bandpass filter, a local oscillation filter, an antenna sharing device, an IF (Intermediate Frequency) filter, or an FM (Frequency Modulation) modulator.

In recent years, there has been an increase in the performance of mobile phone terminals and the like, and along with this, in the exemplary case of a SAW device used in a bandpass filter, there has been demand for improvements in characteristics such as low-loss in the passband, high suppression outside the passband, and temperature stability, as well as demand for a smaller device size. Among these characteristics, improving temperature stability has become an urgent issue in light of the increase in the power density of devices that is due to a reduction in device size, an increase in input power to devices, and the like. To address the temperature stability issue, there have been proposals for improvements by devices whose structures are different from conventional SAW devices of recent years. Examples of a device in which temperature stability is improved include a boundary wave device and a Love wave device in which interdigital electrodes are formed on a piezoelectric substrate, and furthermore a thick dielectric element is formed so as to cover the interdigital electrodes (e.g., see JP 2008-79227A).

The electromechanical coupling coefficient $k^2$ is an important parameter that determines the characteristics of an acoustic wave device. Although the electromechanical coupling coefficient $k^2$ is a constant that is determined by the substrate of the acoustic wave device, in actuality the electromechanical coupling coefficient $k^2$ changes slightly according to, for example, the width dimension and thickness dimension of the interdigital electrodes. Also, when an acoustic wave device filter is manufactured, the frequency characteristics of the filter change slightly according to, for example, the width dimension and thickness dimension of the interdigital electrodes. In order to adjust the electromechanical coupling coefficient $k^2$ and frequency characteristics of the acoustic wave device, it is sufficient to adjust, for example, the width dimension and thickness dimension of the interdigital electrodes. However, since the interdigital electrodes in Love wave devices and boundary wave devices are covered by a thick dielectric element, it is difficult to adjust the width dimension and thickness dimension of the interdigital electrodes in order to adjust the electromechanical coupling coefficient $k^2$, the frequency characteristics, and the like after device manufacturing.

SUMMARY

An acoustic wave device includes: a piezoelectric substrate; interdigital electrodes arranged on the piezoelectric substrate; a first dielectric element arranged between the interdigital electrodes; and a second dielectric element that covers the interdigital electrodes and the first dielectric element, wherein the acoustic wave device further includes an adjustment element on the first dielectric element, and the adjustment element has been formed from a material whose specific gravity is greater than that of the first dielectric element and that of the second dielectric element.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF THE EMBODIMENTS

Figure 1:
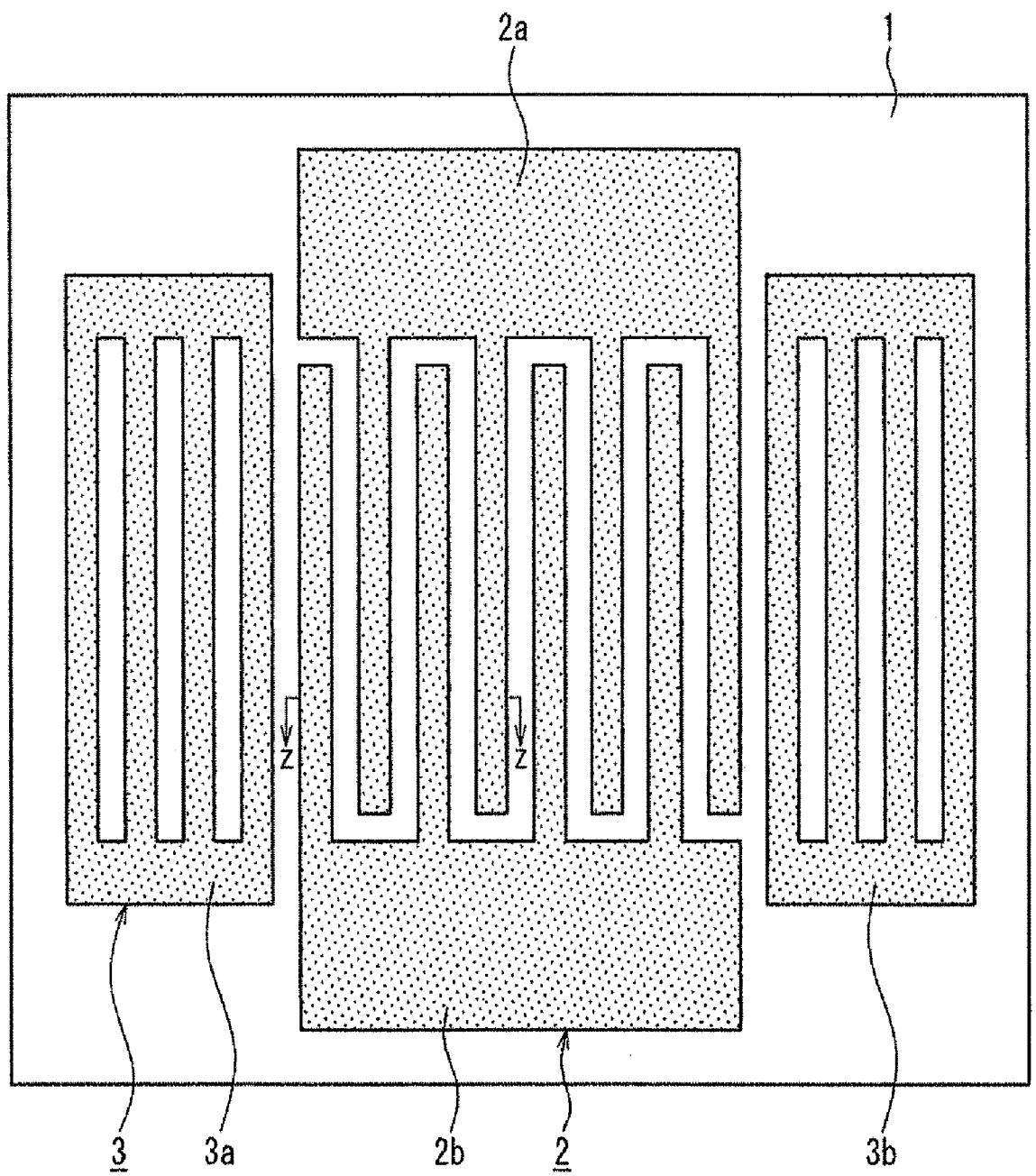
FIG. 1 is a plan view of an acoustic wave device according to an embodiment.

The acoustic wave device can have a configuration in which the adjustment element has been formed from a material whose acoustic velocity is different from that of the first dielectric element and that of the second dielectric element.

The acoustic wave device can have a configuration in which the adjustment element has been formed from a material whose etching rate is faster than that of a material of the interdigital electrodes.

The acoustic wave device can have a configuration in which the adjustment element contains silicon (Si) or a silicon compound.

The acoustic wave device can have a configuration in which the adjustment element contains titanium (Ti) or a metal material.

The acoustic wave device can have a configuration in which the adjustment element has been formed on part of the first dielectric element that has been formed between the interdigital electrodes.

The acoustic wave device can have a configuration in which a cover element is provided on the second dielectric element.

The acoustic wave device can have a configuration in which a main component of the interdigital electrodes is copper (Cu), and a main component of the first dielectric element and the second dielectric element is silicon oxide ($SiO_2$). By forming the interdigital electrodes from a material whose main component is Cu, it is possible to alleviate unintended elimination when etching the adjustment element.

In the acoustic wave device, the piezoelectric substrate may be formed from a material that contains lithium niobate ($LiNbO_3$). This enables ensuring that a filter has a wide passband in the case of manufacturing the filter with use of an acoustic wave device.

A manufacturing method for an acoustic wave device according to an embodiment includes the steps of forming a first dielectric element on a piezoelectric substrate; forming an adjustment element on the first dielectric element; forming a resist pattern on the adjustment element; forming an aperture part by eliminating a portion of the adjustment element and the first dielectric element that is not covered by the resist pattern; forming an electrode element in at least the aperture part; eliminating the resist pattern; evaluating the acoustic wave device and partially eliminating the adjustment element based on a result of the evaluation; and forming a second dielectric element on the electrode element and the adjustment element.

In the manufacturing method for the acoustic wave device, the interdigital electrodes can be formed by a lift-off method.

The manufacturing method for the acoustic wave device may be a method in which the step of evaluating the acoustic wave device includes the steps of measuring a frequency characteristic of the acoustic wave device; calculating an electromechanical coupling coefficient based on the frequency characteristic; comparing the electromechanical coupling coefficient and a target value; setting an etching condition based on a difference between the electromechanical coupling coefficient and the target value; and etching the adjustment element based on the etching condition. According to such method, it is possible to manufacture an acoustic wave device having a desired physical property.

EMBODIMENT

[1. Configuration of Acoustic Wave Device]

Figure 2:
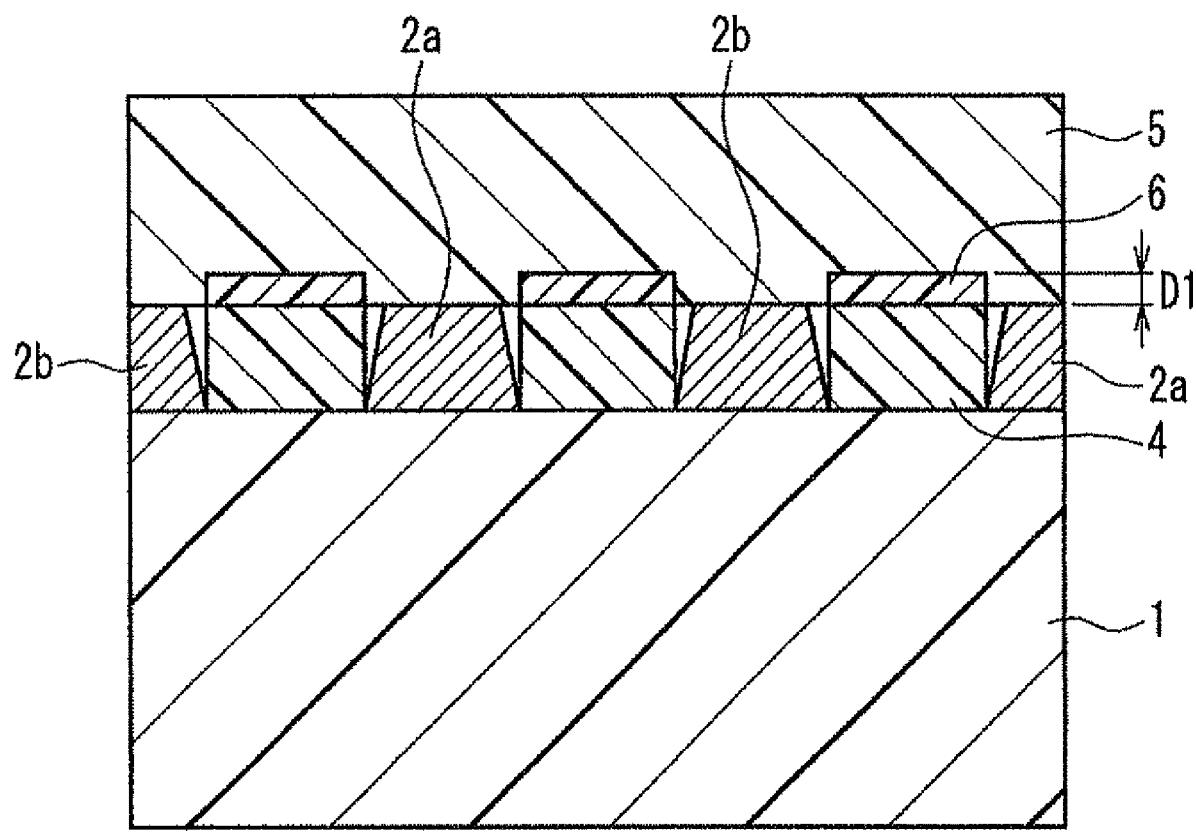
FIG. 2 is a cross-sectional view taken along Z-Z in FIG. 1.

FIG. 1 is a plan view of an acoustic wave device according to an embodiment. FIG. 2 is a cross-sectional view taken along Z-Z in FIG. 1. The acoustic wave device illustrated in FIG. 1 is a 1-port resonator, which is one example of an acoustic wave device. In order to clearly show the structure of interdigital electrodes in FIG. 1, dielectric elements and the like that are formed on the interdigital electrodes have been omitted from the figure.

The acoustic wave device illustrated in FIGS. 1 and 2 is a device that makes use of Love waves, which are one type of surface acoustic waves. The acoustic wave device includes a piezoelectric substrate 1, a interdigital electrode pair 2, a reflector pair 3, a first dielectric element 4, a second dielectric element 5, and an adjustment element 6.

In the present embodiment, the piezoelectric substrate 1 is formed from a material that contains lithium niobate ($LiNbO_3$), but the present embodiment is not limited to this material. The interdigital electrode pair 2 and the reflector pair 3 are formed on the piezoelectric substrate 1, and a main material of the interdigital electrode pair 2 and the reflector pair 3 is copper (Cu). The interdigital electrode pair 2 includes a first interdigital electrode 2a and a second interdigital electrode 2b. The first interdigital electrode 2a and the second interdigital electrode 2b are formed on the piezoelectric substrate 1 such that the electrode fingers thereof are disposed alternately. The reflector pair 3 includes a first reflector 3a and a second reflector 3b. The first reflector 3a is arranged at an end part of the interdigital electrode pair 2 that is on one side in the wave propagation direction. The second reflector 3b is arranged at an end part of the interdigital electrode pair 2 that is on the other side in the wave propagation direction. Note that instead of Cu, the interdigital electrode pair 2 and the reflector pair 3 can be formed from, for example, gold (Au), aluminum (Al), tantalum (Ta), chromium (Cr), tungsten (W), molybdenum (Mo), ruthenium (Ru), or titanium (Ti).

The first dielectric element 4 is arranged between the electrode fingers included in the interdigital electrode pair 2 and reflector pair 3, and a main material of the first dielectric element 4 is silicon oxide ($SiO_2$). The second dielectric element 5 is arranged on the interdigital electrode pair 2 and the adjustment element 6, and a main material of the second dielectric element 5 is $SiO_2$.

The adjustment element 6 is arranged on the first dielectric element 4. The adjustment element 6 is formed in regions that do not include the interdigital electrode pair 2 and reflector pair 3 in FIG. 1. In the present embodiment, the adjustment element 6 is formed from, as one example, silicon (Si). Preferably, the adjustment element 6 is formed from a material whose specific gravity is greater than at least that of the first dielectric element 4 and that of the second dielectric element 5. Preferably, the adjustment element 6 is formed from a material whose acoustic velocity is different from that of the first dielectric element 4 and that of the second dielectric element 5. Preferably, the adjustment element 6 is formed from a material that can add a predetermined mass to the first dielectric element 4. Preferably, the adjustment element 6 is formed from a material that can be dry-etched easily. Instead of Si, the material from which the adjustment element 6 is formed can be a Si compound such as silicon nitride (SiN) or silicon carbide (SiC), or a metal material such as Ti.

Here, it is possible to adjust a physical property of the acoustic wave device, such as the electromechanical coupling coefficient $k^2$ or frequency characteristics, by changing a element thickness D1 of the adjustment element 6. Hereinafter, a description is given of the relationship between the element thickness of the adjustment element 6 and physical properties of the acoustic wave device.

Figure 3A:
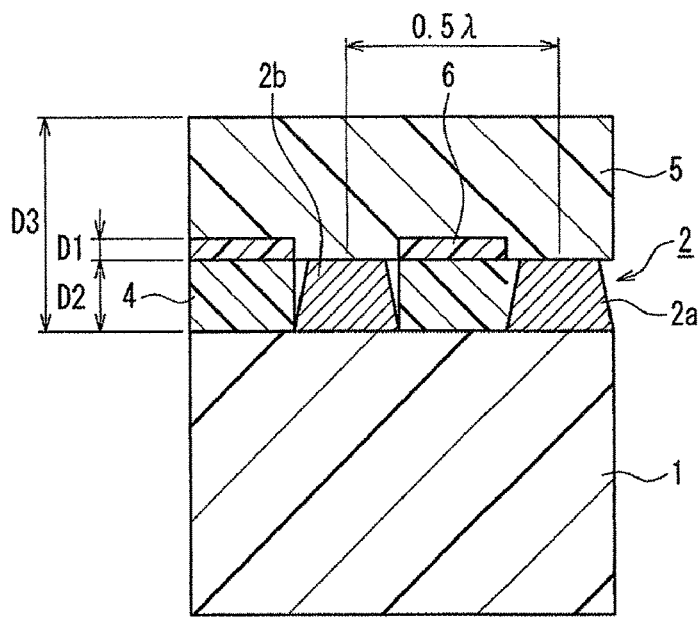
FIG. 3A is a cross-sectional view of a calculation model whose characteristics are illustrated in FIG. 3B.
Figure 3B:
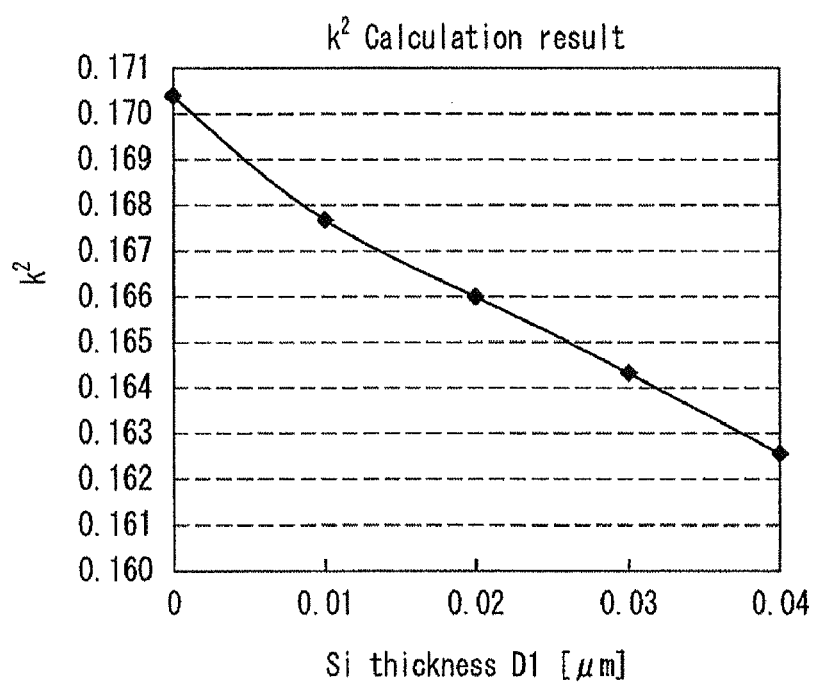
FIG. 3B is a characteristics diagram showing the characteristics of the electromechanical coupling coefficient $k^2$ relative to the thickness of an adjustment element in the acoustic wave device according to the embodiment.

FIG. 3A illustrates a calculation model of an acoustic wave device. The structure of the acoustic wave device illustrated in FIG. 3 is the same as the structure of the acoustic wave device illustrated in FIGS. 1 and 2. FIG. 3B shows electromechanical coupling coefficients $k^2$ in the case of in which the element thickness D1 of the adjustment element 6 formed from Si has been varied between 0 and 0.04 [μm]. In the present embodiment, the value of the electromechanical coupling coefficient $k^2$ is calculated with use of the FEM (Finite Element Method). In the calculation model illustrated in FIG. 3A, it is assumed that an electrode period λ of the interdigital electrode pair 2 is 2 [μm]. An element thickness D2 of the interdigital electrode pair 2 and the first dielectric element 4 is 130 [nm]. A total element thickness D3 of the interdigital electrode pair 2, the second dielectric element 5, and the like formed on the piezoelectric substrate 1 is 0.7 [mm].

In the calculation model illustrated in FIG. 3A, the thickness D1 of the adjustment element 6 was adjusted to 0 [μm], 0.01 [μm], 0.02 [μm], 0.03 [μm], and 0.04 [μm], and an FEM simulation was performed for each value, thus obtaining electromechanical coupling coefficients $k^2$ as illustrated in FIG. 3B. As illustrated in FIG. 3B, the electromechanical coupling coefficient $k^2$ can be reduced by increasing the element thickness D1 of the adjustment element 6. Accordingly, it is possible to adjust the electromechanical coupling coefficient $k^2$ of the acoustic wave device to a desired value by changing the element thickness D1 of the adjustment element 6.

Also, the relationship between electromechanical coupling coefficient $k^2$, resonance frequency $f_r$ of the acoustic wave device, and antiresonance frequency G of the acoustic wave device can be expressed by, for example, the following Expression (1).

$$k^2 = (\pi^2/4) \times (f_r/f_{ar}) \times ((f_{ar}-f_r)/f_{ar}) \quad (1)$$

By changing the electromechanical coupling coefficient $k^2$ through adjusting the thickness D1 of the adjustment element 6 as described above, it is possible to adjust the frequency characteristics of the acoustic wave device. Note that the above Expression (1) is merely an example.

Figure 4A:
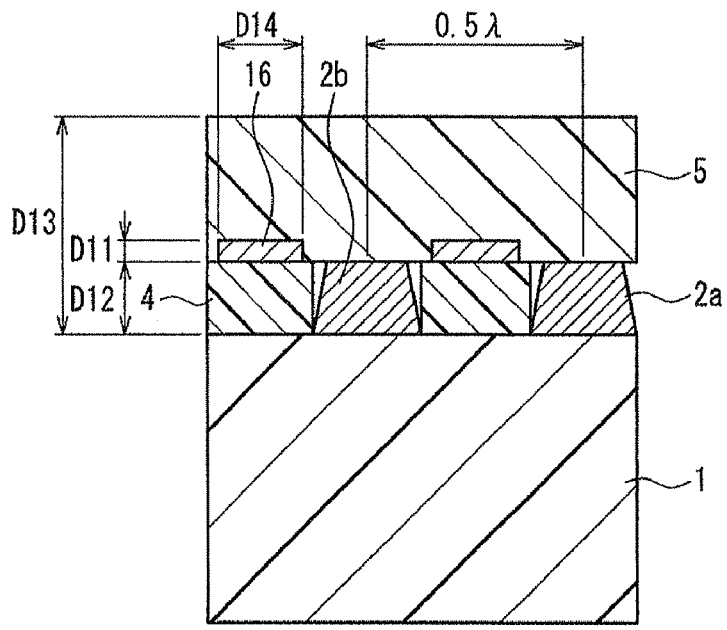
FIG. 4A is a cross-sectional view of a calculation model of an acoustic wave device including a titanium adjustment element.
Figure 4B:
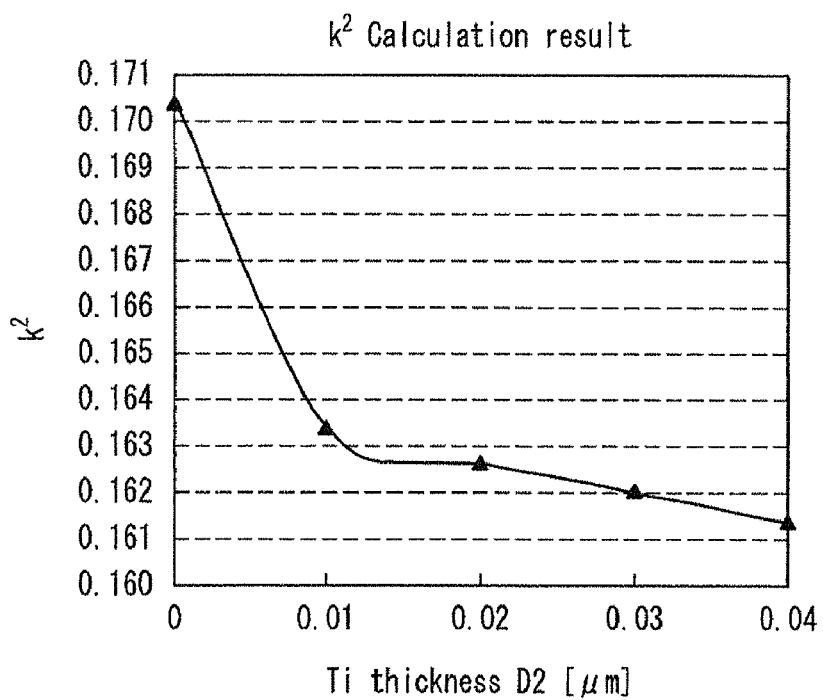
FIG. 4B is a characteristics diagram showing the characteristics of the electromechanical coupling coefficient $k^2$ relative to the thickness of the adjustment element in the calculation model illustrated in FIG. 4A.

Note that although the calculation model illustrated in FIG. 3A is an acoustic wave device whose adjustment element 6 is formed from Si, the same effects can be obtained even if the adjustment element 6 is formed from a metal. FIG. 4A is a cross-sectional diagram showing an acoustic wave device (calculation model) including an adjustment element 16 formed from Ti. FIG. 4B shows electromechanical coupling coefficients $k^2$ in the case in which a element thickness D11 of the adjustment element 16 in the calculation model of the acoustic wave device illustrated in FIG. 4A has been varied between 0 and 0.04 [μm]. The value of the electromechanical coupling coefficient $k^2$ is calculated with use of the FEM. In the calculation model illustrated in FIG. 4A, it is assumed that the electrode period λ of the interdigital electrode pair 2 is 2 [μm]. An element thickness D12 of the interdigital electrode pair 2 and the first dielectric element 4 is 130 [nm]. A total element thickness D13 of the interdigital electrode pair 2, the second dielectric element 5, and the like formed on the piezoelectric substrate 1 is 0.7 [mm]. A width dimension D14 of the adjustment element 16 is 375 [nm].

In the calculation model illustrated in FIG. 4A, the thickness D11 of the adjustment element 16 was adjusted to 0 [μm], 0.01 [μm], 0.02 [μm], 0.03 [μm], and 0.04 [μm], and an FEM simulation was performed for each value, thus obtaining electromechanical coupling coefficients $k^2$ as illustrated in FIG. 4B. As illustrated in FIG. 4B, the electromechanical coupling coefficient $k^2$ can be reduced by increasing the element thickness D11 of the adjustment element 16. Accordingly, it is possible to adjust the electromechanical coupling coefficient $k^2$ of the acoustic wave device to a desired value by changing the element thickness D11 of the adjustment element 16. Also, the relationship between electromechanical coupling coefficient $k^2$, resonance frequency $f_r$ of the acoustic wave device, and antiresonance frequency $f_{ar}$ of the acoustic wave device is as illustrated in the above Expression (1). By changing the electromechanical coupling coefficient $k^2$ through adjusting the thickness D11 of the adjustment element 16, it is possible to adjust the frequency characteristics of the acoustic wave device.

In order to set a physical property of the acoustic wave device, such as the electromechanical coupling coefficient $k^2$ and frequency characteristics, to a desired value, it is sufficient to add a step of adjusting the thickness of the adjustment element 6 to the manufacturing process for the acoustic wave device.

[1-1. Manufacturing Method for Acoustic Wave Device]

The following describes a manufacturing method for a Love wave device, which is an example of an acoustic wave device according to the present embodiment.

FIGS. 5A to 5H are cross-sectional diagrams showing a manufacturing process for the Love wave device that is an example of an acoustic wave device according to the present embodiment.

Figure 5A:
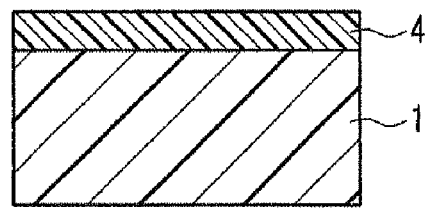
FIGS. 5A to 5H are cross-sectional diagrams showing a manufacturing process for an acoustic wave device according to the embodiment.

First, as illustrated in FIG. 5A, the first dielectric element 4 is formed on the piezoelectric substrate 1. The piezoelectric substrate 1 has been formed from a material that contains $LiNbO_3$. The first dielectric element 4 contains $SiO_2$.

Figure 5B:
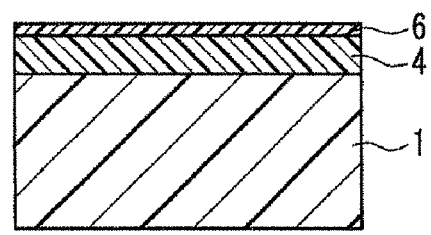

Next, as illustrated in FIG. 5B, the adjustment element 6 is formed on the first dielectric element 4. The adjustment element 6 contains Si. In the present manufacturing process, the element thickness of the adjustment element 6 is 0.04 [μm].

Figure 5C:
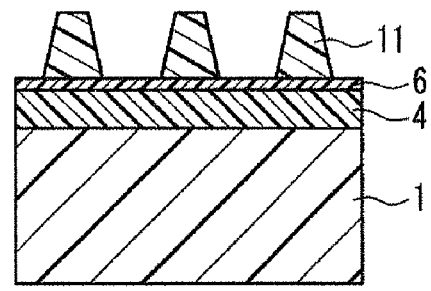

Next, as illustrated in FIG. 5C, a resist pattern 11 is formed on the adjustment element 6. The resist pattern 11 is formed at positions corresponding to where the adjustment element 6 is to ultimately remain.

Figure 5D:
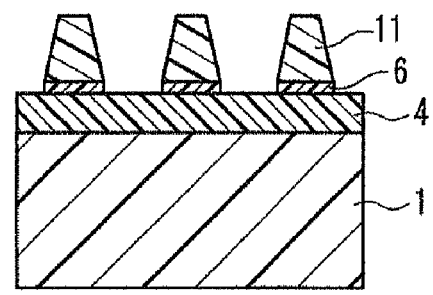

Next, as illustrated in FIG. 5D, the adjustment element 6 is etched.

Figure 5E:
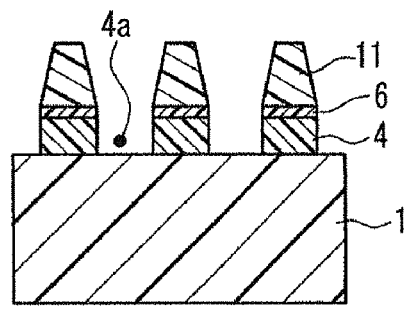

Next, as illustrated in FIG. 5E, the first dielectric element 4 is etched. As a result of etching the first dielectric element 4, apertures 4a are formed in the first dielectric element 4.

Figure 5F:
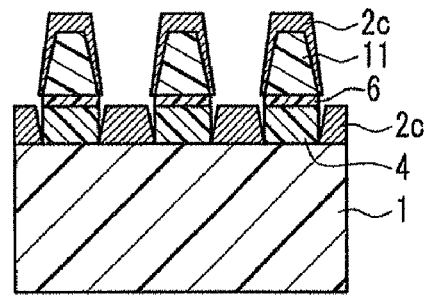

Next, as illustrated in FIG. 5F, an electrode element 2c is formed on the piezoelectric substrate 1 and the resist pattern 11. The electrode element 2c is formed with use of a sputtering method or vapor deposition method. The electrode element 2c contains Cu. The electrode element 2c is formed both on the resist pattern 11 and in the apertures 4a (see FIG. 5E).

Figure 5G:
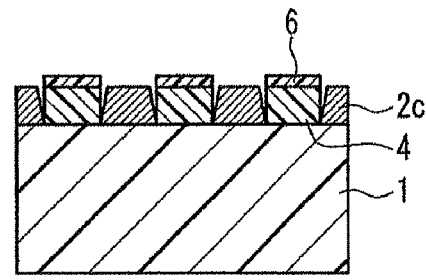

Next, as illustrated in FIG. 5G, the resist pattern 11 is eliminated. Eliminating the resist pattern 11 exposes the adjustment element 6.

Next, the characteristics of the acoustic wave device illustrated in FIG. 5G are measured. The measuring can be performed with use of a probe or the like. Next, a difference between the measured characteristics and target characteristics is calculated, and an etching amount indicating an amount of the adjustment element 6 that is to be etched is determined based on the calculated difference. Note that the method for, for example, evaluating the characteristics of the acoustic wave device is described later. Next, the adjustment element 6 is etched based on the determined etching amount. Performing this etching enables adjusting the element thickness of the adjustment element 6.

Figure 5H:
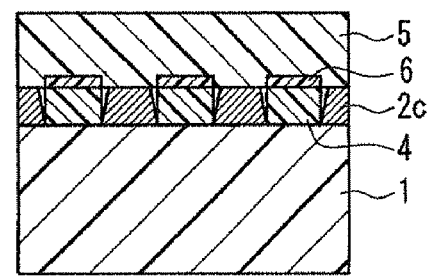

Lastly, as illustrated in FIG. 5H, the second dielectric element 5 is formed on the electrode element 2c and the adjustment element 6. The second dielectric element 5 contains $SiO_2$. This completes the formation of the Love wave device that is an example of an acoustic wave device.

[1-2. Method of Evaluating and Method of Etching the Adjustment Element 6]

Figure 6:
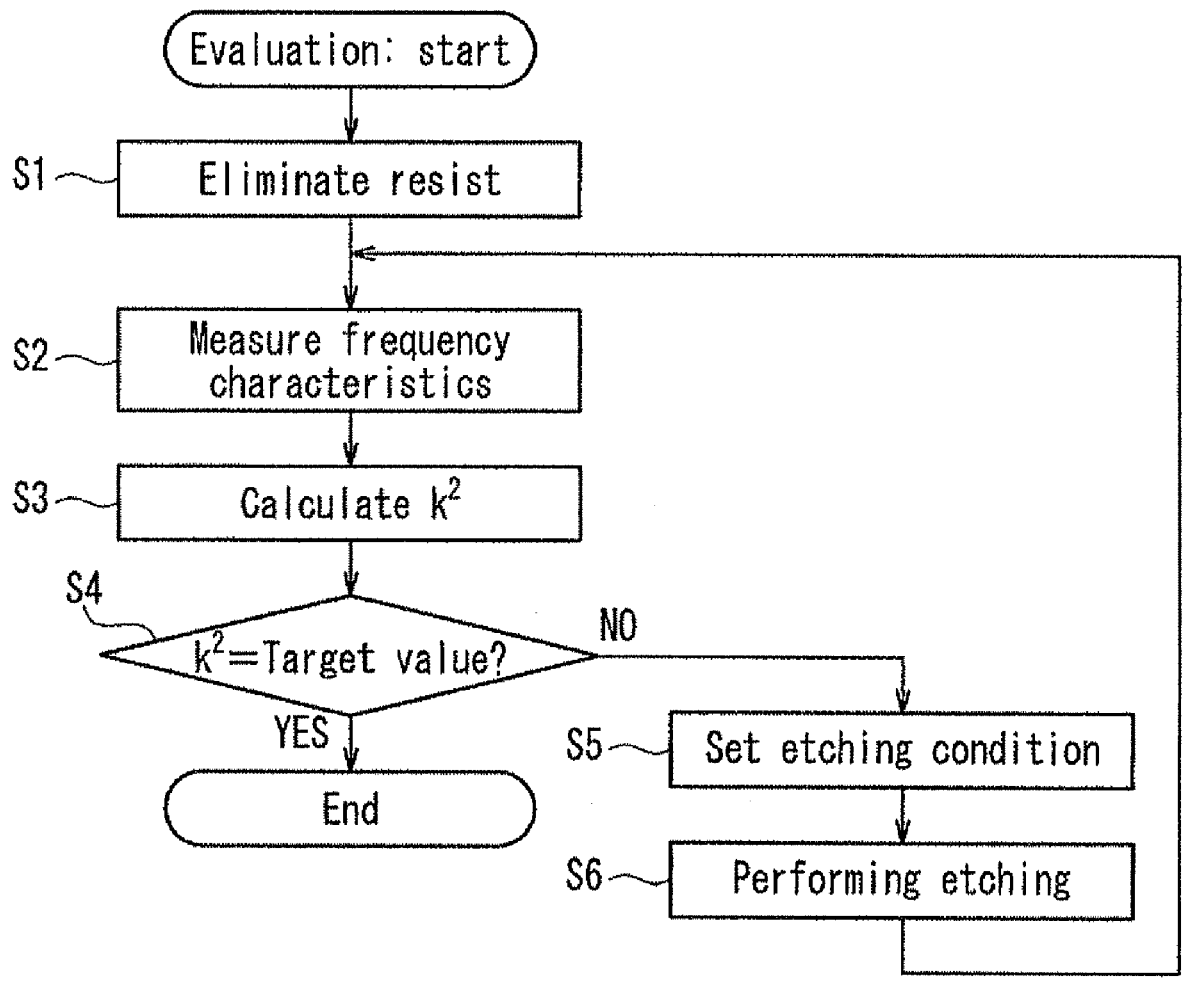
FIG. 6 is a flowchart showing a process of evaluation and etching processing.

FIG. 6 is a flowchart showing a flow of a method of evaluating and steps for etching the adjustment element 6. An acoustic wave device according to the present embodiment can be manufactured by, for example, adding steps for forming and etching the adjustment element 6 in the lift-off method. Accordingly, it is possible to manufacture an acoustic wave device whose adjustment element 6 has an arbitrary element thickness. Note that the lift-off method is a method used mainly in the case in which the interdigital electrode pair 2 has been formed from a material that is difficult to dry-etch, such as Cu.

In the manufacturing process of the present embodiment, after the resist pattern has been eliminated (Si), first the frequency characteristics of the acoustic wave device are measured using a probe or the like (S2). Examples of the frequency characteristics that are measured include the resonance frequency and antiresonance frequency. Next, the electromechanical coupling coefficient $k^2$ is calculated based on the measured frequency characteristics (S3). The electromechanical coupling coefficient $k^2$ can be calculated based on, for example, Expression (1).

Next, the calculated electromechanical coupling coefficient $k^2$ and a target electromechanical coupling coefficient $k^2$ that has been set in advance are compared, and if the calculated electromechanical coupling coefficient $k^2$ and the target electromechanical coupling coefficient $k^2$ match, the evaluation is ended, and the process moves to the step for forming the second dielectric element 5.

On the other hand, if the calculated electromechanical coupling coefficient $k^2$ and the target electromechanical coupling coefficient $k^2$ do not match, conditions for etching the adjustment element 6 are set (S5). The etching conditions are set based on the difference between the calculated electromechanical coupling coefficient $k^2$ and the target electromechanical coupling coefficient $k^2$. The etching conditions are a type of etching gas and a value such as a gas flow amount, which are in accordance with the material that is the target of etching. As one example in the present embodiment, $SF_6$ is used as the etching gas. The gas flow amount was set to 100 [sccm]. The pressure was set to 5 [Pa]. The power was set to 20 [W]. The etching rate was set to 0.8 [nm/s]. The etching time was set in accordance with the target electromechanical coupling coefficient $k^2$. The method for setting the etching time is described later.

Next, the adjustment element 6 is dry-etched based on the set etching conditions (S6).

Next, once again the frequency characteristics of the acoustic wave device are measured (S2), and the electromechanical coupling coefficient $k^2$ is calculated (S3). Thereafter, the above-described flow is repeated until the calculated electromechanical coupling coefficient $k^2$ and the target electromechanical coupling coefficient $k^2$ match (until the result of S4 is Yes).

Note that instead of being limited to a complete match between the calculated electromechanical coupling coefficient $k^2$ and the target electromechanical coupling coefficient $k^2$, the determination of a "match" in step S5 includes approximate values for which operational problems do not occur in the acoustic wave device.

Also, the etching conditions in the etching of the adjustment element 6 in step S6 are not limited to the conditions described above. The etching conditions B and C illustrated in Table 1 can be applied. Note that the conditions A in Table 1 are the etching conditions employed in the present embodiment. The conditions B and C are etching conditions employed in the case of etching an adjustment element that contains Ti.

TABLE 1

SPECIFIC CONDITIONS FOR DRY-ETCHING

| | FILM TO BE ETCHED | ETCHING GAS TYPE | GAS FLOW AMOUNT (sccm) | PRESSURE (Pa) | POWER (W) | ETCHING RATE (nm/s) |
|---|---|---|---|---|---|---|
| CONDITION A | Si | $SF_6$ | 100 | 5 | 20 | 0.8 |
| CONDITION B | Ti | $CF_4$ | 50 | 1 | 50 | 0.2 |
| CONDITION C | Ti | $SF_6$ | 200 | 10 | 50 | 0.3 |

Also, the etching time in step S6 can be determined in accordance with the target electromechanical coupling coefficient $k^2$. Table 2 shows a correspondence between the electromechanical coupling coefficient $k^2$ of the acoustic wave device and etching times. Table 2 shows electromechanical coupling coefficients $k^2$ of the acoustic wave device in the cases in which the adjustment element 6 containing Si was the target of etching, the conditions illustrated in Table 1 were employed, and the etching time used in the etching was set to 1 [s], 10 [s], 25 [s], and 38 [s].

TABLE 2

RELATIONSHIP BETWEEN ELECTROMECHANICAL COUPLING COEFFICIENT $k^2$ AND ETCHING TIME (WHEN ADJUSTMENT FILM IS Si AND TARGET $k^2$ IS 0.169)

| | $k^2$ | | | |
|---|---|---|---|---|
| | 0.163 | 0.165 | 0.167 | 0.169 |
| ETCHING TIME (s) | 38 | 25 | 10 | 1 |

In the examples illustrated in Table 2, for example, in the case in which the target electromechanical coupling coefficient $k^2$ is 0.169, an acoustic wave device having a desired electromechanical coupling coefficient $k^2$ can be manufactured by setting the etching time to 1 [s], and etching the adjustment element 6.

Also, although the interdigital electrode pair 2 is formed from a material containing Cu and the adjustment element 6 is formed from a material containing Si in the present embodiment, the material of the interdigital electrode pair 2 and the material of the adjustment element 6 are not limited to these. The combination of the material of the interdigital electrode pair 2 and the material of the adjustment element 6 can be set to, for example, the combinations illustrated in Table 3. Table 3 also shows etching gas types that are suited for the combinations of the material of the interdigital electrode pair 2 and the material of the adjustment element 6.

TABLE 3

COMBINATION OF ELECTRODE AND ADJUSTMENT FILM

| ELECTRODE MATERIAL | ADJUSTMENT FILM MATERIAL | ETCHING GAS TYPE |
|---|---|---|
| Au, Cu, Al, Ta, Cr, W, Mo, Ru | Si, Ti, SiN, SiC | $SF_6$, $CF_4$ |
| Au, Al, Ti, Ta, Cr, W, Mo, Ru | C | $O_2$ |
| Au, Cu, Ta, Cr, W, Mo, Ru | Al | Cl, $BCl_3$ |

Also, the manufacturing of a Love wave device and the like is normally performed using, for example a φ 100 [mm] wafer. The etching of the adjustment element 6 may be performed on the entire wafer. Also, the etching of the adjustment element 6 may be performed on a portion of acoustic wave devices formed on the wafer. Also, the etching of the adjustment element 6 may be performed for each individual acoustic wave device formed on the wafer.

Figure 7:
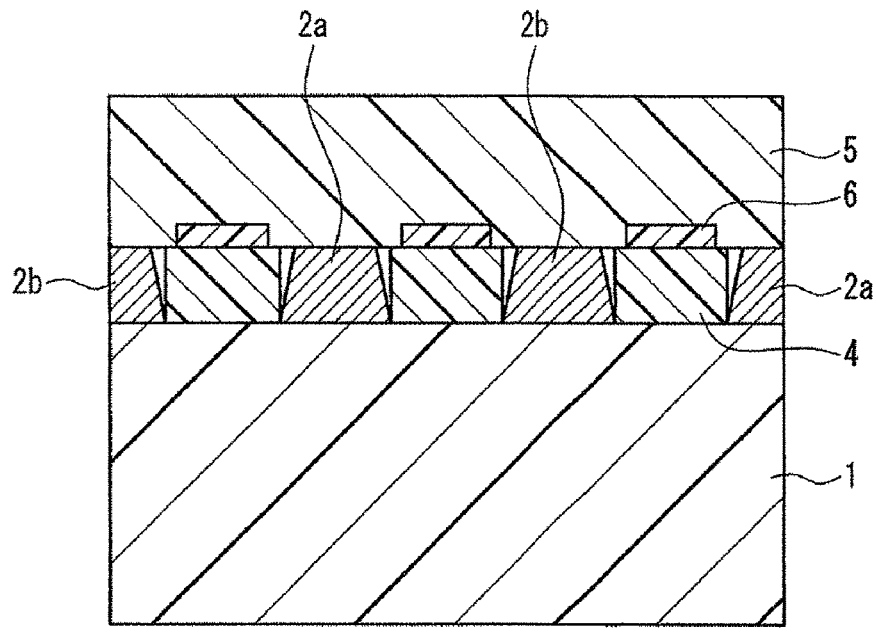
FIG. 7 is a cross-sectional view of an acoustic wave device in which the adjustment element has been etched in the horizontal direction.

Also, in the etching of the adjustment element 6, there are cases in which etching is also performed in the horizontal direction (the direction of the face of the piezoelectric substrate 1 on which the interdigital electrode pair 2 has been formed). For example, case of etching the adjustment element 6 that contains Si, etching also proceeds in the horizontal direction if etching is performed using $SF_6$ gas and using a high pressure of approximately 10 [Pa]. If the etching proceeds in the horizontal direction, the adjustment element 6 partially covers the first dielectric element 4 as illustrated in FIG. 7. In the adjustment element 6 illustrated in FIG. 7, the value of the electromechanical coupling coefficient $k^2$ varies from the values illustrated in Table 2, but it is possible to obtain a desired electromechanical coupling coefficient $k^2$ by adjusting the element thickness through adjusting the etching conditions and etching time.

Figure 8:
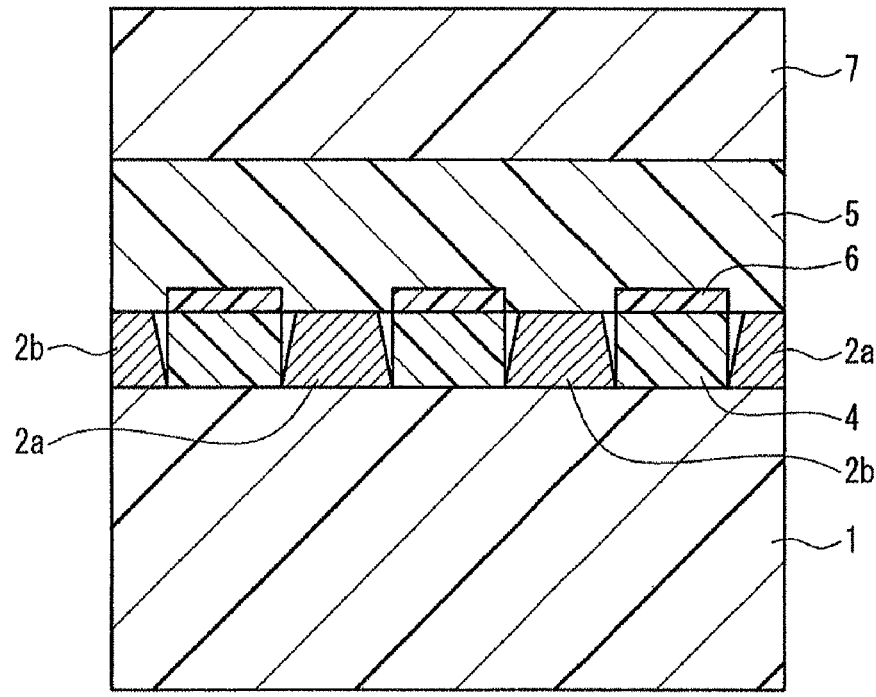
FIG. 8 is a cross-sectional view of an acoustic boundary wave device that is an example of an acoustic wave device according to the embodiment.

Also, although a Love wave device is given as an example of an acoustic wave device in the present embodiment, the present embodiment is also applicable to a boundary wave device. FIG. 8 is a cross-sectional view of a boundary wave device. As illustrated in FIG. 8, in the boundary wave device, a cover element 7 has been formed over the second dielectric element 5 of the Love wave device illustrated in FIG. 7 and the like. In this kind of boundary wave device as well, the same effects as the present embodiment can be obtained by forming the kind of adjustment element 6 described in the present embodiment.

Figure 9:
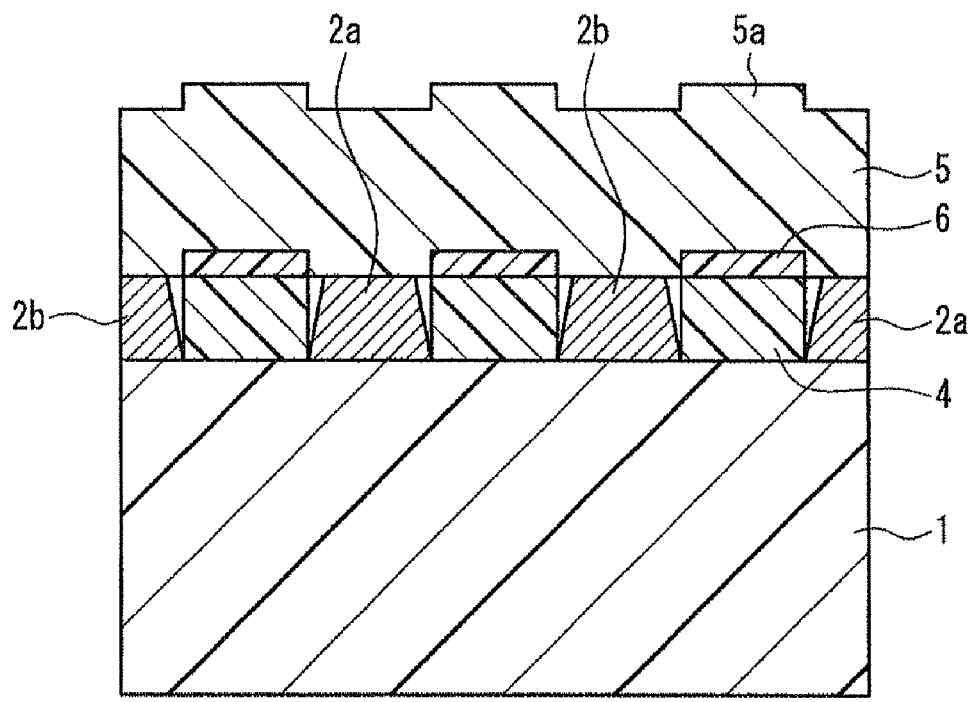
FIG. 9 is a cross-sectional diagram showing another exemplary configuration of an acoustic wave device according to the embodiment.

Also, in the case in which an acoustic wave device has been manufactured based on the manufacturing steps illustrated in FIGS. 5A to 5H, there are cases in which the height of the surface of the electrode element 2c and the height of the surface of the adjustment element 6 are not the same, as illustrated in FIG. 5G. In the case in which the second dielectric element 5 has been formed on such electrode element 2c and adjustment element 6, projections 5a are formed on the upper face of the second dielectric element 5 as illustrated in FIG. 9. In the manufacturing steps illustrated in FIGS. 5A to 5H, the second dielectric element 6 is formed, and thereafter the projections formed on the upper face of the second dielectric element 6 are eliminated. But even if the projections 5a are not eliminated and remain as illustrated in FIG. 9, there is not a large influence on the electromechanical coupling coefficient $k^2$ or the frequency characteristics of the acoustic wave device that is ultimately completed, and the same effects as the present embodiment can be obtained.

[2. Configuration of Duplexer]

Duplexers are included in portable communication (high-frequency wireless communication) apparatuses such as mobile phone terminals, PHS (Personal Handy-phone System) terminals, and wireless LAN systems. Duplexers are used in a wireless apparatus that have the functions of transmitting and receiving communications radio waves and the like, and in which the frequencies of a transmission signal and a reception signal are different.

Figure 10:
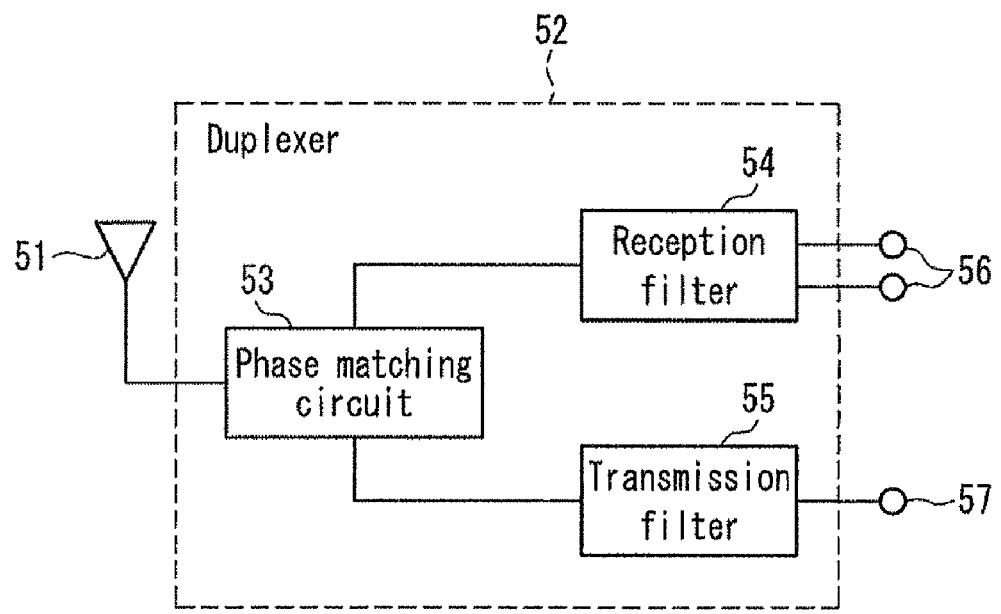
FIG. 10 is a block diagram showing a duplexer.

FIG. 10 illustrates a configuration of a duplexer including an acoustic wave device of the present embodiment. A duplexer 52 includes a phase matching circuit 53, a reception filter 54, and a transmission filter 55. The phase matching circuit 53 is an element for adjusting the phase of the impedance of the reception filter 54 in order to prevent transmission signals output from the transmission filter 55 from flowing into the reception filter 54 side. The phase matching circuit 53 is connected to an antenna 51. The reception filter 54 is configured from a bandpass filter that passes, among reception signals input via the antenna 51, only a predetermined frequency band. The reception filter 54 is connected to an output terminal 56. The transmission filter 55 is configured from a bandpass filter that passes, among transmission signals input via an input terminal 57, only a predetermined frequency band. Also, the transmission filter 55 is connected to the input terminal 57. Here, an acoustic wave device of the present embodiment is included in the reception filter 54 and the transmission filter 55.

Including an acoustic wave device of the present embodiment in the reception filter 54 and the transmission filter 55 enables improving the manufacturing yield and realizing an even lower-cost duplexer.

[3. Configuration of Communication Module]

Figure 11:
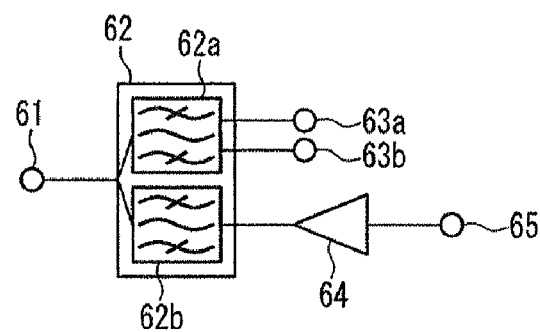
FIG. 11 is a block diagram showing a communication module.

FIG. 11 illustrates an example of a communication module that includes an acoustic wave device according to the present embodiment. As illustrated in FIG. 11, a duplexer 62 includes a reception filter 62a and a transmission filter 62b. The reception filter 62a is connected to reception terminals 63a and 63b that are compatible with, for example, balanced output. The transmission filter 62b is connected to a transmission terminal 65 via a power amplifier 64. Here, the duplexer 62 can be realized by a duplexer that includes an acoustic wave device according to the present embodiment.

In the case of performing a reception operation, the reception filter 62 passes, among reception signals input via an antenna terminal 61, only signals in a predetermined frequency band, and externally outputs such signals via the reception terminals 63a and 63b. Also, in the case of performing a transmission operation, the transmission filter 62b passes, among transmission signals input from the transmission terminal 65 and amplified by the power amplifier 64, only signals in a predetermined frequency band, and externally outputs such signals via the antenna terminal 61.

Including an acoustic wave device according to the present embodiment or a duplexer having the same in the communication module enables improving the manufacturing yield and realizing an even lower-cost communication module.

Note that the communication module illustrated in FIG. 11 is an example, the same effects are obtained even if an acoustic wave device of the present embodiment is included in a communication module having another form.

[4. Configuration of Communication Apparatus]

Figure 12:
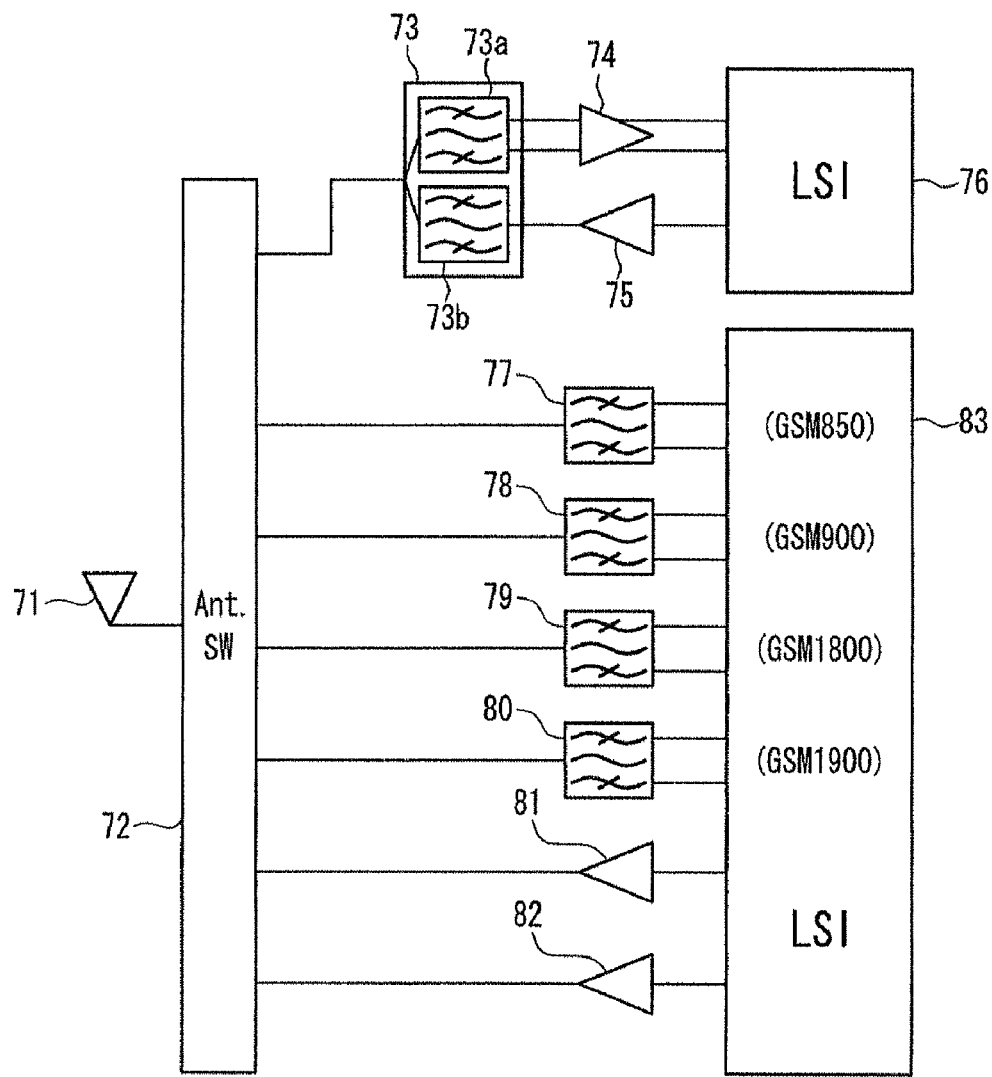
FIG. 12 is a block diagram showing a communication apparatus.

FIG. 12 illustrates an RF block of a mobile phone terminal as an example of a communication apparatus including an acoustic wave device, duplexer, or the above-described communication module according to the present embodiment. FIG. 12 illustrates a configuration of a mobile phone terminal that is compatible with the GSM (Global System for Mobile Communications) communication system and the W-CDMA (Wideband Code Division Multiple Access) communication system. In the present embodiment, the GSM communication system is compatible with the 850 MHz band, the 950 MHz band, the 1.8 GHz band, and the 1.9 GHz band. Also, although the mobile phone terminal includes a microphone, a speaker, a liquid crystal display and the like in addition to the configuration illustrated in FIG. 12, such elements are not illustrated in the figure since they are unnecessary to the description of the present embodiment. Here, a duplexer 73 can be realized by a duplexer that includes a high frequency wave device according to the present embodiment.

First, an LSI that is targeted for operation is selected by an antenna switch circuit 72 based on whether the communication system of a reception signal input via an antenna 71 is W-CDMA or GSM. If the input reception signal is compatible with the W-CDMA communication system, switching is performed so that the reception signal is output to the duplexer 73. The reception signal input to the duplexer 73 is limited to a predetermined frequency band by a reception filter 73a, and the balanced reception signal is output to an LNA 74. The LNA 74 amplifies the input reception signal, and outputs the amplified signal to an LSI 76. In the LSI 76, processing for demodulation to an audio signal is performed based on the input reception signal, and the operation of units in the mobile phone terminal is controlled.

On the other hand, in the case of transmitting a signal, the LSI 76 generates a transmission signal. The generated transmission signal is amplified by a power amplifier 75 and input to a transmission filter 73b. The transmission filter 73b passes, among the input transmission signals, only signals in a predetermined frequency band. The transmission signals output from the transmission filter 73b are sent to the antenna switch circuit 72 and then externally output via the antenna 71.

Also, if the input reception signal is a signal compatible with the GSM communication system, the antenna switch circuit 72 selects one of reception filters 77 to 80 in accordance with the frequency band, and outputs the reception signal to the selected reception filter. The band of the reception signal is limited by the selected one of the reception filters 77 to 80, and the resulting signal is input to an LSI 83, The LSI 83 performs processing for demodulation to an audio signal based on the input reception signal, and controls the operation of units in the mobile phone terminal. On the other hand, in the case of transmitting a signal, the LSI 83 generates a transmission signal. The generated transmission signal is amplified by a power amplifier 81 or 82, sent to the antenna switch circuit 72, and externally output via the antenna 71.

Including an acoustic wave device, duplexer, or communication module according to the present embodiment in the communication apparatus enables improving the manufacturing yield and realizing an even lower-cost communication apparatus.

[5. Effects of the Embodiment and Other Remarks]

According to the present embodiment, the adjustment element 6 is provided on the first dielectric element 4, and furthermore the adjustment element 6 is formed from a material whose specific gravity is greater than at least that of the first dielectric element 4 and that of the second dielectric element 5. Thus enabling easily adjusting the electromechanical coupling coefficient $k^2$, frequency characteristics, and the like. For example, it is possible to adjust the electromechanical coupling coefficient $k^2$, frequency characteristics, and the like while the device is in a state of near-completion. As a result, it is possible to improve the manufacturing yield of the device, and an even lower-cost acoustic wave device can be realized.

Also, the adjustment element 6 is preferably formed from a material whose acoustic velocity is different from that of the first dielectric element 4 and that of the second dielectric element 5. According to such a configuration, it is possible to adjust the electromechanical coupling coefficient $k^2$, frequency characteristics, and the like while the device is in a state of near-completion, and the manufacturing yield of the device can be improved. It is therefore possible to realize an even lower-cost acoustic wave device.

Also, the adjustment element 6 is preferably formed from a material whose etching rate is faster than that of the material of the interdigital electrode pair 2. According to such a configuration, it is possible to adjust the electromechanical coupling coefficient $k^2$, frequency characteristics, and the like while the device is in a state of near-completion, and the manufacturing yield of the device can be improved. It is therefore possible to realize an even lower-cost acoustic wave device.

Also, the adjustment element 6 is preferably formed from a material that contains silicon (Si) or a silicon compound. Such a configuration has the advantage that etching can be easily performed in the manufacturing process.

The present embodiment is useful to an acoustic wave device, a duplexer, a communication module, and a communication apparatus. The present embodiment is also useful to a manufacturing method for an acoustic wave device.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:

1. An acoustic wave device comprising:
   a piezoelectric substrate;
   interdigital electrodes arranged on the piezoelectric substrate;
   a first dielectric element arranged between the interdigital electrodes; and
   a second dielectric element that covers the interdigital electrodes and the first dielectric element,
   wherein the acoustic wave device further comprises an adjustment element on the first dielectric element,
   the adjustment element is disposed only on the first dielectric element, and
   the adjustment element has been formed from a material whose specific gravity is greater than that of the first dielectric element and that of the second dielectric element.

2. The acoustic wave device according to claim 1,
wherein the adjustment element has been formed from a material whose acoustic velocity is different from that of the first dielectric element and that of the second dielectric element.

3. The acoustic wave device according to claim 1,
wherein the adjustment element has been formed from a material whose etching rate with respect to an etching gas that is one of $SF_6$, $CF_4$, $O_2$, Cl, and $BCL_3$ is faster than that of a material of the interdigital electrodes.

4. A manufacturing method for an acoustic wave device, comprising the steps of:
    forming a first dielectric element on a piezoelectric substrate;
    forming an adjustment element on the first dielectric element;
    forming a resist pattern on the adjustment element;
    forming an aperture part by eliminating a portion of the adjustment element and the first dielectric element that is not covered by the resist pattern;
    forming an electrode element in the aperture part;
    eliminating the resist pattern;
    evaluating the acoustic wave device and partially eliminating the adjustment element based on a result of the evaluation; and
    forming a second dielectric element on the electrode element and the adjustment element.

5. The manufacturing method for the acoustic wave device according to claim 4,
    wherein the step of evaluating the acoustic wave device includes the steps of:
    measuring a frequency characteristic of the acoustic wave device;
    calculating an electromechanical coupling coefficient based on the frequency characteristic;
    comparing the electromechanical coupling coefficient and a target value;
    setting an etching condition based on a difference between the electromechanical coupling coefficient and the target value; and
    etching the adjustment element based on the etching condition.

6. A duplexer comprising an acoustic wave device, the acoustic wave device including:
    a piezoelectric substrate;
    interdigital electrodes arranged on the piezoelectric substrate;
    a first dielectric element arranged between the interdigital electrodes; and
    a second dielectric element that covers the interdigital electrodes and the first dielectric element,
    wherein the acoustic wave device further comprises an adjustment element on the first dielectric element,
    the adjustment element is disposed only on the first dielectric element, and
    the adjustment element has been formed from a material whose specific gravity is greater than that of the first dielectric element and that of the second dielectric element.

7. A communication module comprising an acoustic wave, the acoustic wave device including:
    a piezoelectric substrate;
    interdigital electrodes arranged on the piezoelectric substrate;
    a first dielectric element arranged between the interdigital electrodes; and
    a second dielectric element that covers the interdigital electrodes and the first dielectric element,
    wherein the acoustic wave device further comprises an adjustment element on the first dielectric element,
    the adjustment element is disposed only on the first dielectric element, and
    the adjustment element has been formed from a material whose specific gravity is greater than that of the first dielectric element and that of the second dielectric element.

8. A communication apparatus comprising an acoustic wave device,
    the acoustic wave device including:
    a piezoelectric substrate;
    interdigital electrodes arranged on the piezoelectric substrate;
    a first dielectric element arranged between the interdigital electrodes; and
    a second dielectric element that covers the interdigital electrodes and the first dielectric element,
    wherein the acoustic wave device further comprises an adjustment element on the first dielectric element,
    the adjustment element is disposed only on the first dielectric element, and
    the adjustment element has been formed from a material whose specific gravity is greater than that of the first dielectric element and that of the second dielectric element.

* * * * *